(12) United States Patent
Yin et al.

(10) Patent No.: US 9,659,810 B2
(45) Date of Patent: May 23, 2017

(54) METHOD OF MAKING A FINFET DEVICE

(71) Applicant: Taiwan Semiconductor Manufacturing Company, Ltd., Hsin-Chu (TW)

(72) Inventors: Joanna Chaw Yane Yin, Hsinchu (TW); Chi-Hsi Wu, Hsinchu (TW); Kuo-Chiang Ting, Hsinchu (TW); Chen Kuang-Hsin, Jung-Li (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 94 days.

(21) Appl. No.: 14/248,403

(22) Filed: Apr. 9, 2014

(65) Prior Publication Data

US 2014/0291770 A1 Oct. 2, 2014

Related U.S. Application Data

(63) Continuation of application No. 13/490,108, filed on Jun. 6, 2012, now Pat. No. 8,697,515.

(51) Int. Cl.
| | | |
|---|---|---|
| *H01L 29/66* | (2006.01) | |
| *H01L 21/762* | (2006.01) | |
| *H01L 21/8234* | (2006.01) | |
| *H01L 27/088* | (2006.01) | |
| *H01L 21/8238* | (2006.01) | |
| *H01L 21/84* | (2006.01) | |

(52) U.S. Cl.
CPC ........... *H01L 21/76224* (2013.01); *H01L 21/823431* (2013.01); *H01L 21/823821* (2013.01); *H01L 21/845* (2013.01); *H01L 27/0886* (2013.01); *H01L 29/6681* (2013.01)

(58) Field of Classification Search
CPC .......................... H01L 21/845; H01L 27/0886
See application file for complete search history.

(56) References Cited

U.S. PATENT DOCUMENTS

| | | | |
|---|---|---|---|
| 6,849,549 B1 | 2/2005 | Chiou et al. | |
| 6,987,289 B2 | 1/2006 | Nowak | |
| 7,723,171 B2 | 5/2010 | Yagishita et al. | |
| 7,829,951 B2 | 11/2010 | Song et al. | |
| 7,919,364 B2 | 4/2011 | Sonsky et al. | |
| 8,003,466 B2 | 8/2011 | Shi et al. | |
| 8,420,459 B1 | 4/2013 | Cheng et al. | |
| 9,324,713 B1* | 4/2016 | Yu ...................... H01L 27/0886 | |
| 2005/0282342 A1* | 12/2005 | Adan ................. H01L 29/7851 | |
| | | | 438/294 |
| 2010/0203734 A1 | 8/2010 | Shieh et al. | |

(Continued)

OTHER PUBLICATIONS

T. Yamashita et at., "Sub-25nm FinFET With Advanced Fin Formation and Short Channel Effect Engineering", 2011 Symposium on VLSI Technology Digest of Technical Papers, 978-4-86348-164-0, pp. 14-15.

*Primary Examiner* — Seahvosh Nikmanesh
(74) *Attorney, Agent, or Firm* — Haynes and Boone, LLP (57) ABSTRACT

The present disclosure provides many different embodiments of fabricating a FinFET device that provide one or more improvements over the prior art. In one embodiment, a method of fabricating a FinFET includes providing a semiconductor substrate and a plurality of dummy fins and active fins on the semiconductor substrate. A predetermined group of dummy fins is removed.

20 Claims, 13 Drawing Sheets (56) References Cited

U.S. PATENT DOCUMENTS

| | | |
|---|---|---|
| 2011/0068407 A1 | 3/2011 | Yeh et al. |
| 2013/0059401 A1 | 3/2013 | Sudo |
| 2013/0330889 A1 | 12/2013 | Yin et al. |
| 2016/0268257 A1* | 9/2016 | Lim .................... H01L 27/0886 |
| 2016/0351664 A1* | 12/2016 | Leobandung ....... H01L 27/1211 |
| 2016/0380058 A1* | 12/2016 | Basker .............. H01L 21/32105 257/401 |

* cited by examiner

METHOD OF MAKING A FINFET DEVICE

PRIORITY DATA

This application is a continuation application of U.S. application Ser. No. 13/490,108, filed Jun. 6, 2012, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, a variation of fin width and profile, especially at an end of the fin, raises challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B-1, 2B-2, 2B-3, 3, 4, 5, and 6 illustrate cross sectional views of one embodiment in various stages of fabricating a FinFET device constructed according to aspects of the present disclosure.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present application are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

Figure 1:
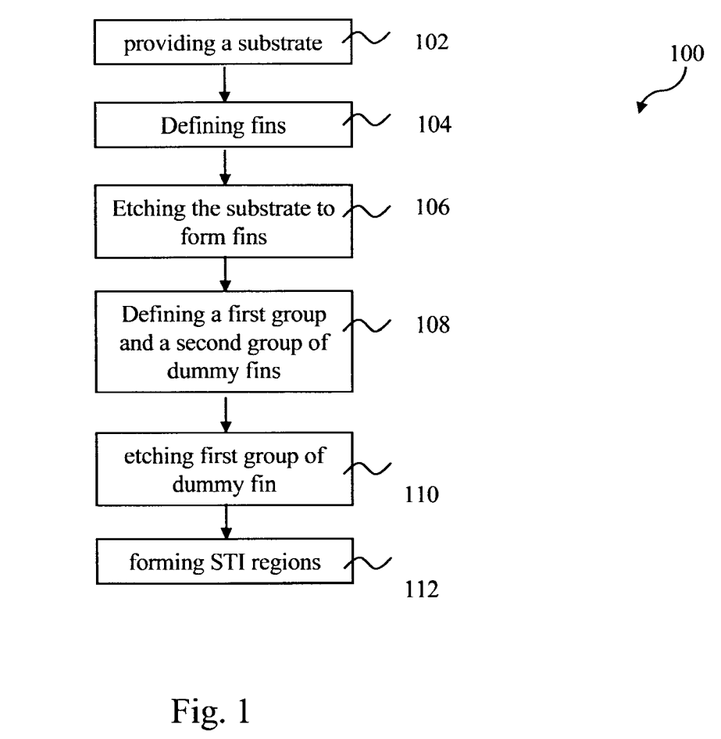
FIG. 1 is a flow chart of an example method for fabricating a FinFET device according to various aspects of the present disclosure.
Figure 2A:
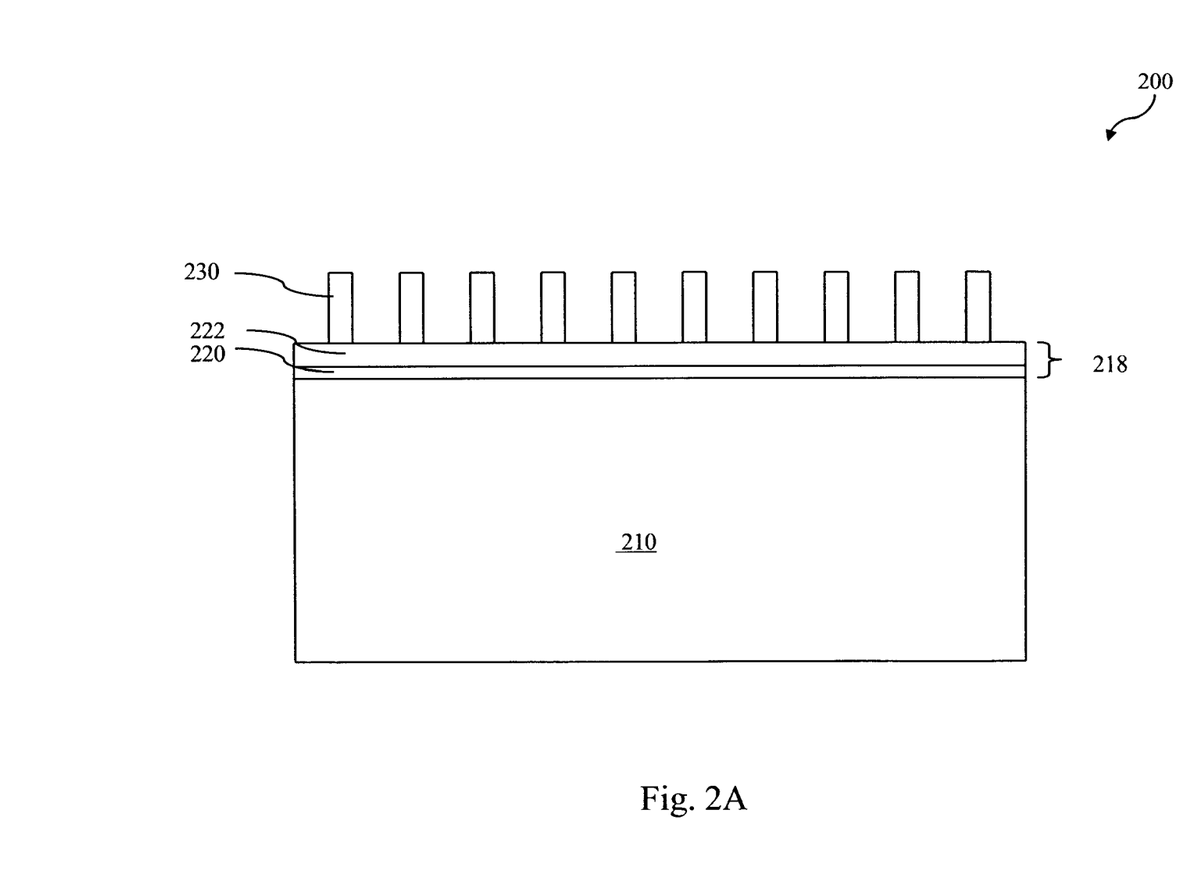
Figure 2B:
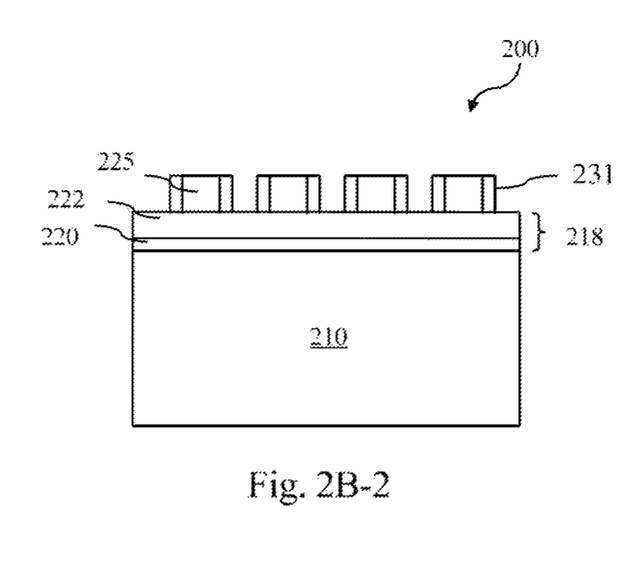
Figure 2B:
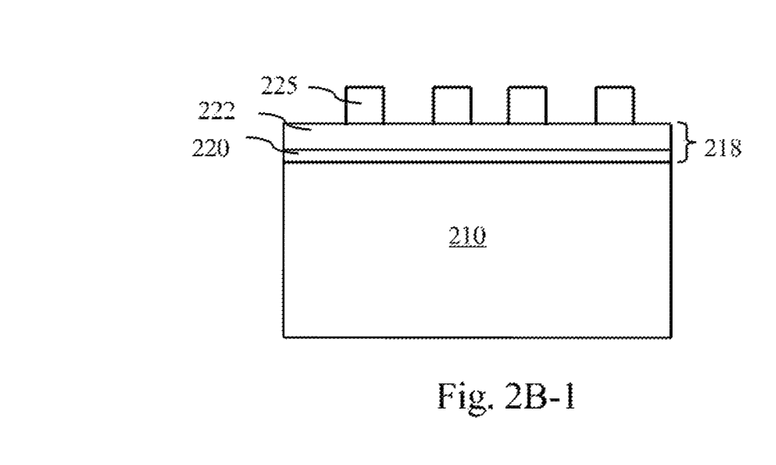
Figure 2B:
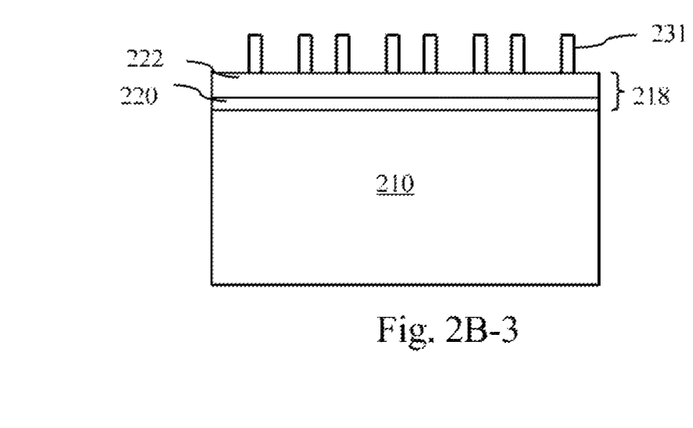

With reference to FIGS. 1 and 2-6, a method 100 and a FinFET device 200 are collectively described below. FIG. 1 is a flow chart of a method 100 for fabricating a FinFET device according to various aspects of the present disclosure.

Referring to FIGS. 1 and 2, the method 100 begins at step 102 by providing a semiconductor substrate 210. The semiconductor substrate 210 includes silicon. Alternatively, the semiconductor substrate 210 may include germanium, silicon germanium, gallium arsenide or other appropriate semiconductor materials. Also alternatively, the semiconductor substrate 210 may include an epitaxial layer. For example, the semiconductor substrate 210 may have an epitaxial layer overlying a bulk semiconductor. Further, the semiconductor substrate 210 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such stained substrate may be formed by selective epitaxial growth (SEG). Furthermore, the semiconductor substrate 210 may include a semiconductor-on-insulator (SOI) structure. Also alternatively, the semiconductor substrate 210 may include a buried dielectric layer, such as a buried oxide (BOX) layer, such as that formed by separation by implantation of oxygen (SIMOX) technology, wafer bonding, SEG, or other appropriate method.

The method 100 proceeds to step 104 by defining a plurality fins on the semiconductor substrate 210, as shown in FIG. 2. In the depicted embodiment, a pad layer 218 is formed on the substrate 210. The pad layer 218 includes a dielectric material, such as silicon oxide, silicon nitride, silicon oxynitride, or any other suitable dielectric material. The pad layer 218 may be a single layer or multiple layers. In the present embodiment, the pad layer 218 is a dual layer that includes a silicon oxide layer 220 deposited on the semiconductor substrate 210 and a silicon nitride layer 222 deposited on the silicon oxide layer 220. The pad layer 218 can be formed by thermal oxidation, chemical oxidation, atomic layer deposition (ALD), or any other appropriate method.

Referring also to FIG. 2, a lithography process defines fins on the semiconductor substrate 210. In the present embodiment, a patterned photoresist layer 230 is spin-on coated on the pad layer 218. The patterned photoresist layer 230 defines fins of the FinFET device 200. Generally, a patterning process may include photoresist coating (e.g., spin-on coating), soft baking, mask aligning, exposing, post-exposure baking, developing the photoresist, rinsing, drying (e.g., hard baking), other suitable processes, or combinations thereof. Alternatively, the photolithography exposing process is implemented or replaced by other proper methods such as maskless photolithography, electron-beam writing, direct-writing, and/or ion-beam writing.

Figure 3:
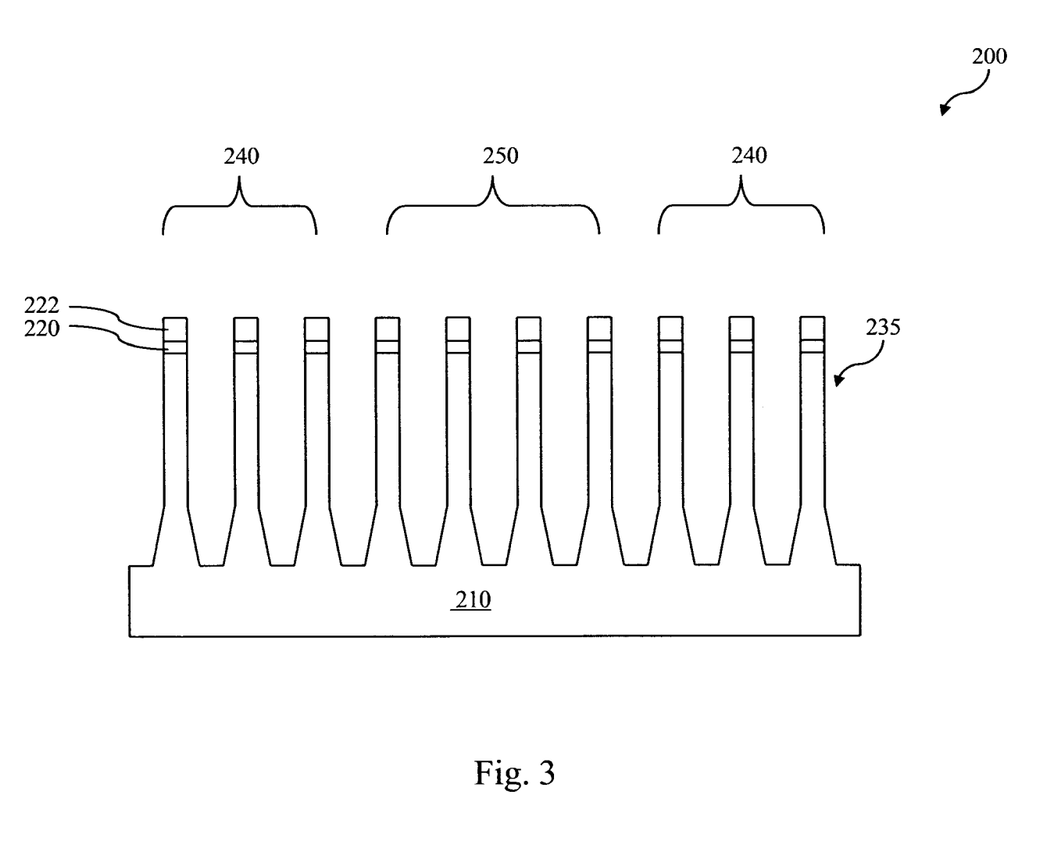

Referring to FIGS. 1 and 3, the method 100 proceeds to step 106 by performing a trench etching to form a fin structure 235 in the semiconductor substrate 210. The patterned photoresist layer 230 is used as a mask during the trench etching. In the trench etching, the pad layer 218 and the semiconductor substrate 210 may be etched by various methods, including a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), oxygy-containing gas, iodine-containing gas, other suitable gases and/or plasmas, or combinations thereof. The etching process may include a multiple-step etching to gain etch selectivity, flexibility and desired etch profile.

Referring to FIG. 3, the fin structure 235 includes dummy fins 240 and active fins 250. The dummy fins 240 have no functionality in the FinFET device 200 but make FinFET processes more uniform, more reproducible and more manufacturable. The active fins 250 have functionality in the FinFET device 200. The active fins 250 are disposed between the dummy fins 240. Having the dummy fins 240 located next to the active fins 250, each of the active fins 250 may be formed under a fairly similar formation surrounding in all associated locations. The formation surrounding may include the dimension of open spacing on both side of a fin and local feature density. A consistent formation surrounding enhances a uniform active fin 250 in all associated locations, in term of fin's critical dimension (CD), profile and height.

Figure 4:
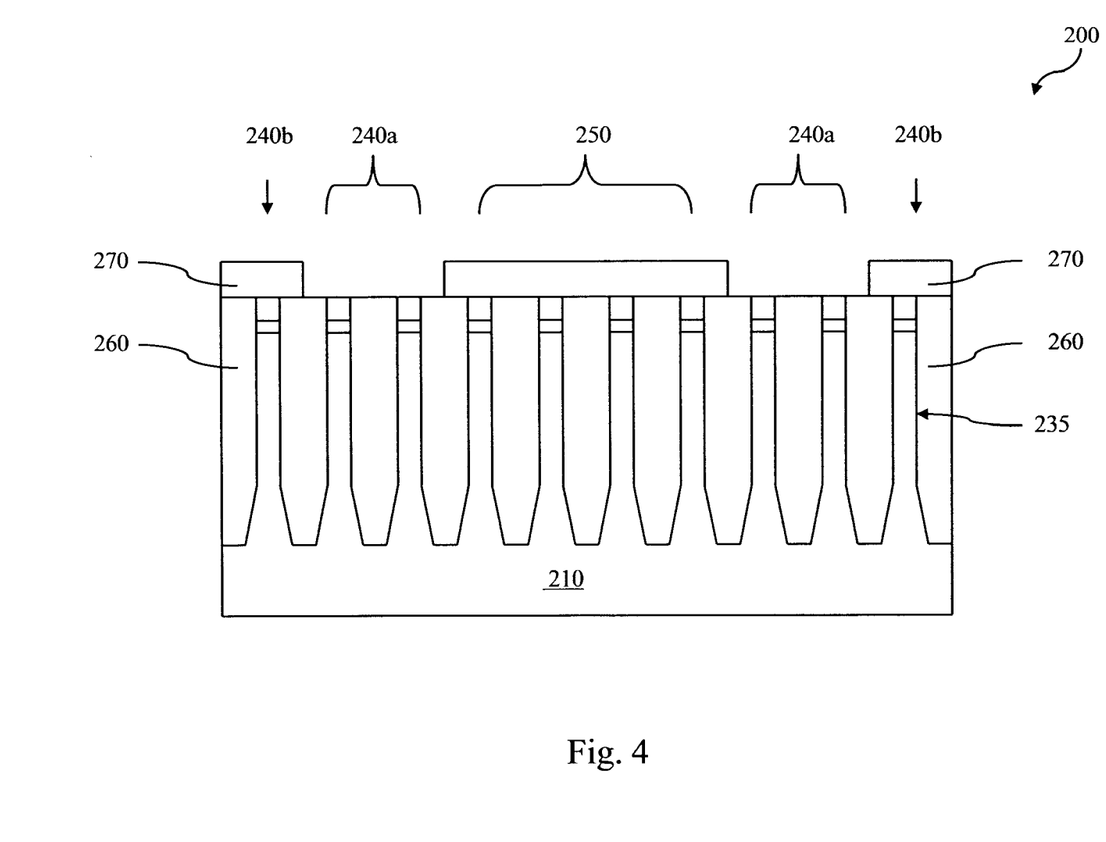

Referring to FIGS. 1 and 4, the method 100 proceeds to step 108, where a patterned photoresist layer 270 is formed to define groups of dummy fins 240. By the patterning process, the dummy fins 240 are divided into a first group of dummy fins 240a and a second group of dummy fins 240b, as shown in FIG. 4. The groups of dummy fins 240a and 240b may include one dummy fin or multiple dummy fins. The first group of dummy fins 240a is exposed within openings of the patterned photoresist layer 270 and will be exposed to a subsequent etching process. The second group of dummy fins 240b is covered by the patterned photoresist layer 270 (the patterned photoresist layer 270 also covers the active fins 250), such that the second group of dummy fins 240b (and the active fins 250) remains intact during a subsequent etching process. Additionally, in the depicted embodiment, before forming the patterned photoresist layer 270, a layer 260 is formed on the semiconductor substrate 210 and fills in trenches between the fins of the fin structure 235. The layer 260 comprises any suitable material and is formed by any suitable process. For example, the layer 260 may include various organic or inorganic materials. The photoresist layer 270 is coated on the layer 260 and patterned by a suitable patterning process.

Figure 5:
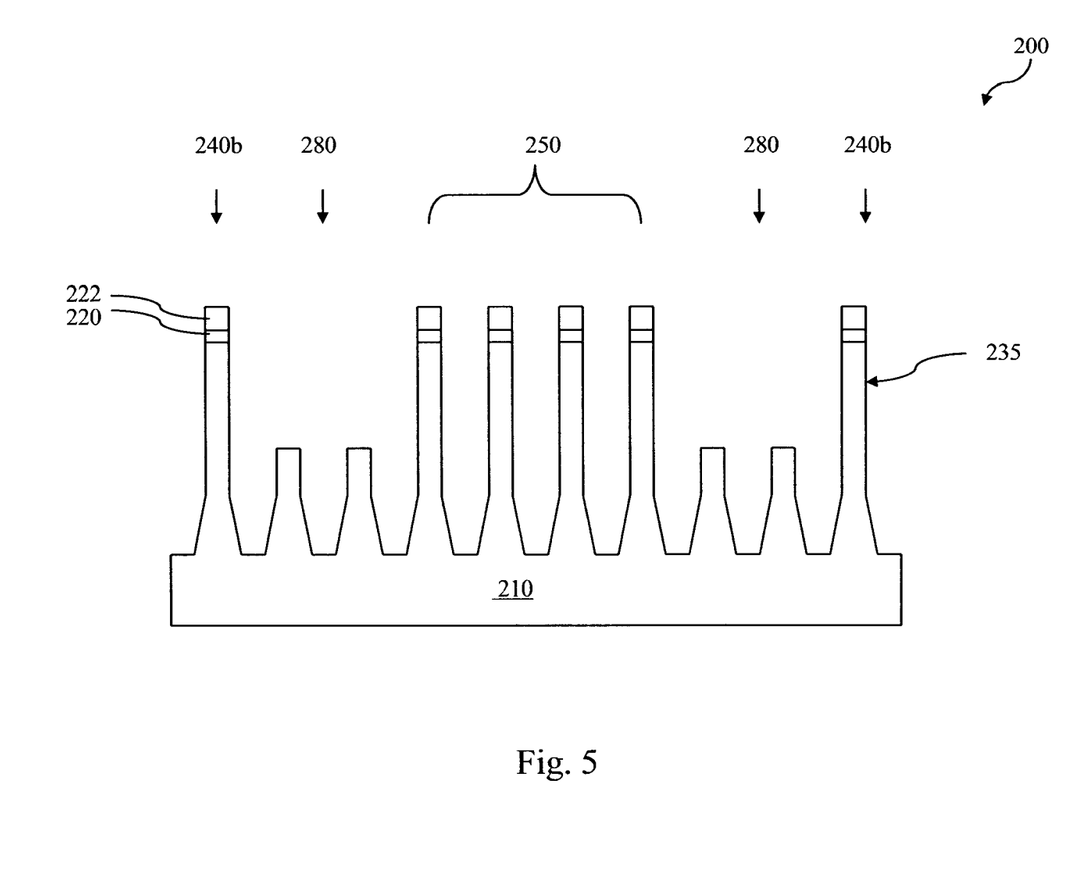

Referring to FIGS. 1 and 5, the method 100 proceeds to step 110 by removing the first group of dummy fins 240a, which is exposed within openings of the patterned photoresist layer 270. In the depicted embodiment, the first group of dummy fins 240a and the layer 260 are removed to form a plurality open-spacing 280, as shown in FIG. 5. The open-spacing 280 is formed between the active fins 250 and the second group of dummy fins 240b. In one embodiment, the open-spacing 280 is formed also between two active fins 250. The first group of dummy fins 240a is removed by an etching technique, such as a dry etch in a chemistry with fluorine-containing gases. In one embodiment, the first group of dummy fins 240a is removed partially. In another embodiment, the first group of dummy fins 240a is removed completely. After etching the first group of dummy fins 240a, the patterned photoresist layer 270 and the layer 260 are removed by another etching process including a wet etch, a dry etch, or a combination thereof. The open-spacing 280 is designed to serve as a stress buffer during downstream shallow trench isolation (STI) formation and reduce distortion of the active fins 250 caused by the stress. The second group of dummy fins 240b is designed to minimize process loading effect and reduce process variations.

Figure 6:
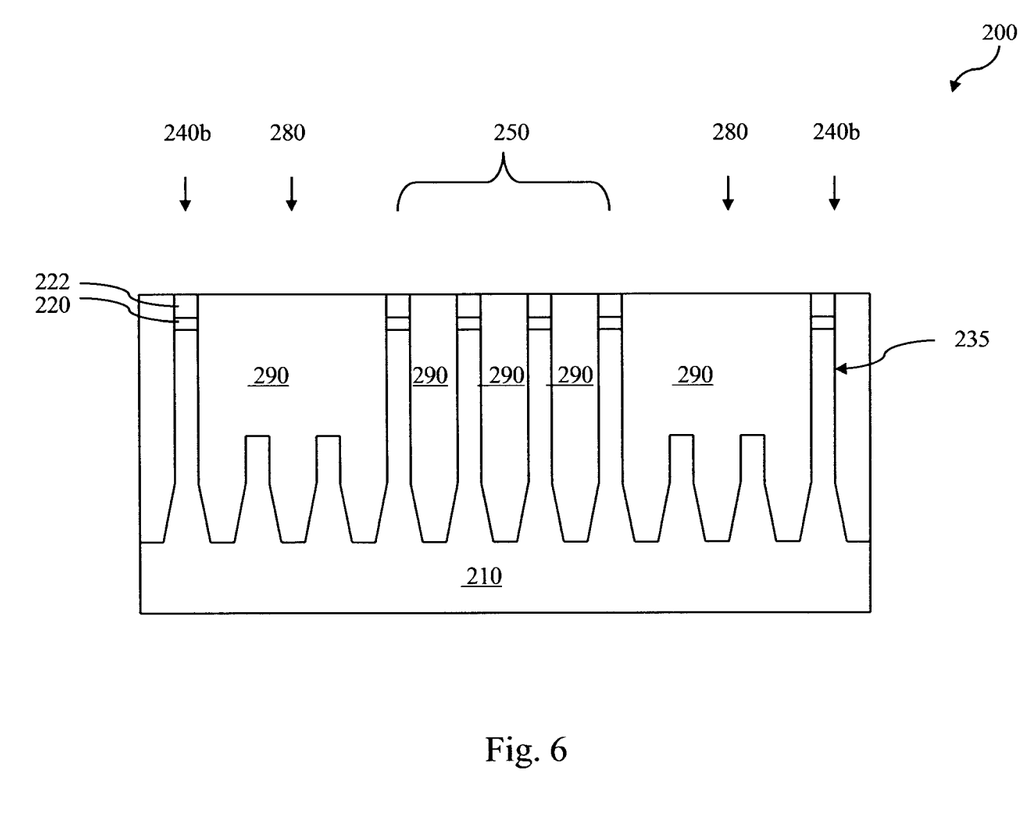

Referring to FIGS. 1 and 6, the method 100 proceeds to step 112 by filling trenches between fins with a dielectric material to form STI regions 290 on the semiconductor substrate 210. The STI regions 290 comprises silicon oxide, silicon nitride, silicon oxynitride, other suitable materials, or combinations thereof. The STI region 290 is formed by any suitable process. As one example, the STI regions 290 is formed by filling the trench between fins with one or more dielectric materials by using a chemical vapor deposition (CVD). In some examples, the filled trench may have a multi-layer structure such as a thermal oxide liner layer filled with silicon nitride or silicon oxide. An annealing process may be performed after the formation of the STI region 290.

After forming the STI region 290, the FinFET device 200 may undergo further CMOS or MOS technology processing to form various features and regions known in the art. For example, further fabrication processes may include, among other things, forming a gate structure over the semiconductor substrate 210, including over a portion of the active fins 250 and the second group of dummy fins 240b and forming source and drain (S/D) regions on each side of the gate structure, including another portion of the active fins 250 and the second group of dummy fins 240b. The formation of the gate structure may include depositing, patterning, and etching processes. A gate spacer may be formed on the walls of the gate structure by deposition and etching techniques. S/D regions may be formed by recess, epitaxially growing and implant techniques. Additional steps can be provided before, during, and after the method 100, and some of the steps described can be replaced or eliminated for other embodiments of the method.

Subsequent processing may also form various contacts/vias/lines and multilayer interconnect features (e.g., metal layers and interlayer dielectrics) on the semiconductor substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 7:
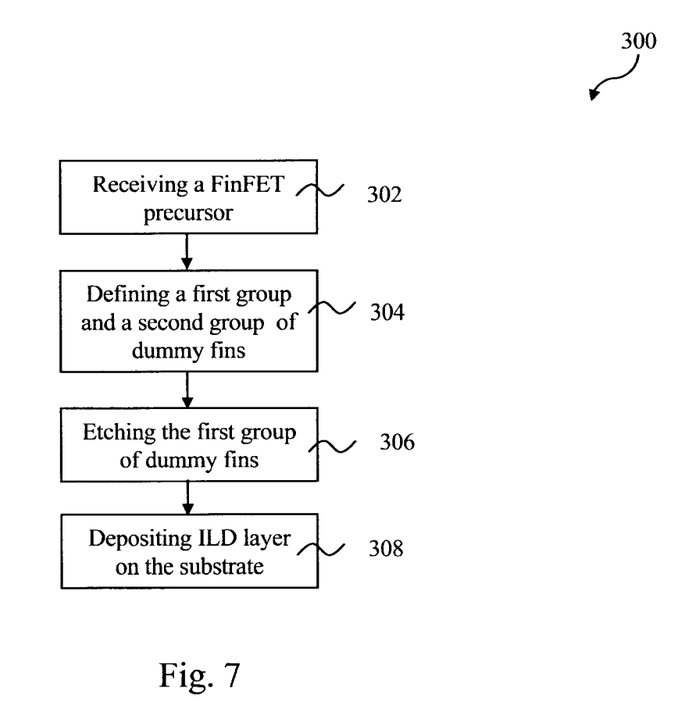
FIG. 7 is another flow chart of another example method for fabricating a FinFET device according to various aspects of the present disclosure.

In another embodiment, a method 300 for fabricating a FinFET device 400 is provided. With reference to FIGS. 7 and 8-11, the method 300 and the FinFET device 400 are collectively described below. FIG. 7 is a flow chart of the method 300 for fabricating the FinFET device 400 according to various aspects of the present disclosure.

Figure 8:
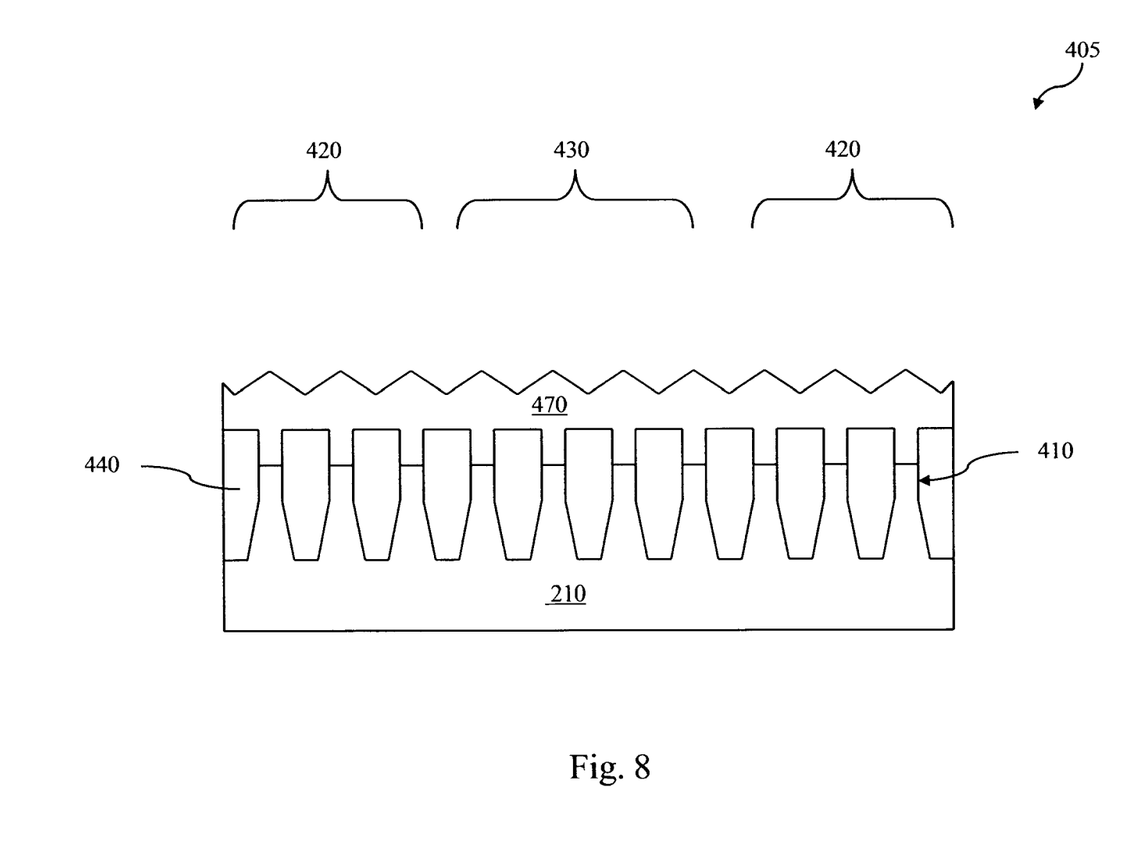
FIGS. 8, 9, 10 and 11a illustrate cross sectional views of one embodiment in various stages of fabricating a FinFET device constructed according to aspects of the present disclosure.
Figure 9:
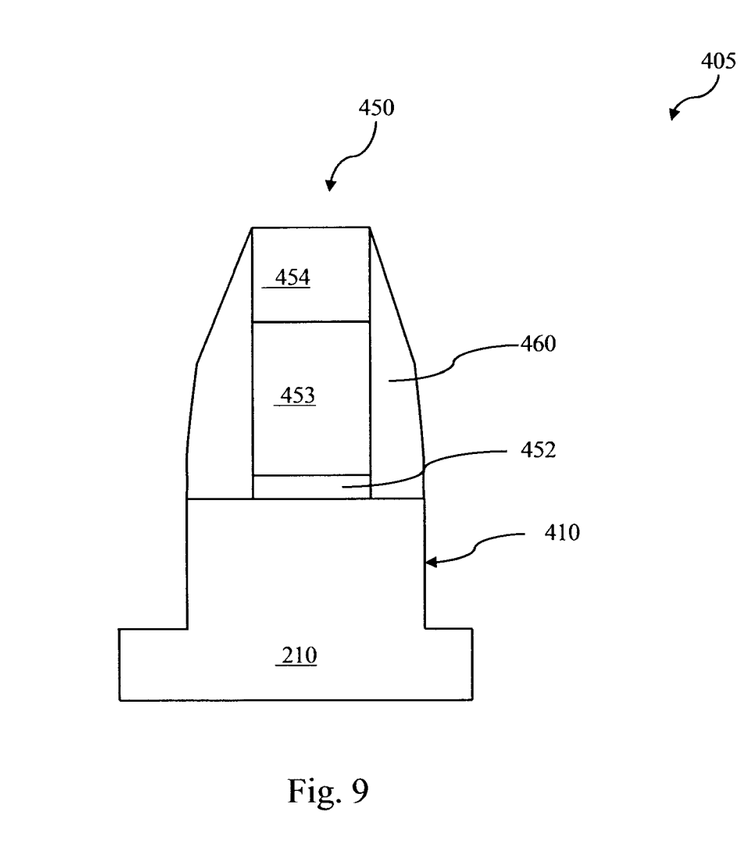

Referring to FIGS. 7 and 8-9, the method 300 begins at block 302 where a FinFET precursor 405 is received. The FinFET precursor 405 includes the semiconductor substrate 210 and a fin structure 410 that includes dummy fins 420 and active fins 430. The fin structure 410 is formed substantially similar as the fin structure 235 described with reference to FIGS. 2 and 3, such that the active fins 430 experience a consistent formation surrounding during fin formation and gains a uniform fin's CD, profile and height in all associated locations.

Referring also to FIG. 8, the FinFET precursor 405 also includes isolation regions 440 in the semiconductor substrate 210. The isolation regions 440 utilize isolation technology, such as STI, to define and electrically isolate various regions of the FinFET device 400. The isolation regions 440 comprise silicon oxide, silicon nitride, silicon oxynitride, or other suitable materials, or combinations thereof. The isolation regions 440 are formed by any suitable process. In the present embodiment, a plurality of trenches between fins are filled with silicon oxide on the semiconductor substrate 210 to form the isolation regions 440. An annealing process may be performed after the formation of the isolation regions 440. The annealing process includes rapid thermal annealing (RTA), laser annealing processes, or other suitable annealing processes. A chemical mechanical polishing (CMP) process may be performed subsequently to remove excess silicon oxide to provide a substantially planar surface. Additionally, a portion of fins of the dummy fins 420 and the active fins 430 may be recessed further by suitable patterning and etching processes known in the art, as shown in FIG. 8.

Referring also to FIG. 8, the FinFET precursor 405 also includes raised sources and drains (S/D) structure 470, which is formed on portions of the dummy fins 420 and the active fins 430, referred to as S/D regions. The raised S/D structure 470 may be formed by one or more epitaxy or epitaxial (epi) processes, such that Si features, SiGe features, or other suitable features are formed in a crystalline state on the recessed surfaces of the dummy fins 420 and the active fins 430 in the S/D region. The epitaxy processes include CVD deposition techniques (e.g., vapor-phase epitaxy (VPE) and/or ultra-high vacuum CVD (UHV-CVD)), molecular beam epitaxy, and/or other suitable processes. The raised S/D structure 470 may be merged because of close proximity of the dummy fins 420 and the active fins 430.

Referring to FIG. 9, the FinFET precursor 405 also includes gate stacks 450 and gate spacers 460 formed over the semiconductor substrate 210, including over (wrapping) a portion of fins of the fin structure 410 (referred as to a channel region). The gate stack 450 may include an interfacial layer (not shown), a gate dielectric layer 452, a gate electrode layer 453, and a hard mask layer 454. It is understood that the gate stack 450 may comprise additional layers such as interfacial layers, capping layers, diffusion/barrier layers, dielectric layers, conductive layers, other suitable layers, or combinations thereof.

The interfacial layer is formed over the semiconductor substrate 210 and fins, 420 and 430. The interfacial layer includes silicon oxide, silicon oxynitride or any suitable materials. The gate dielectric layer 452 is formed over the interfacial layer. The gate dielectric layer 452 comprises a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof.

The gate electrode layer 453 is formed over the gate dielectric layer 452. The gate electrode layer 453 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. The hard mask layer 454 is formed over the gate electrode layer 453. The hard mask layer 454 comprises any suitable material, for example, silicon nitride, SiON, SiC, SiOC, or other suitable material.

The gate stack 450 is formed by any suitable process or processes. For example, the gate stack 450 can be formed by a procedure including photolithography patterning and etching processes. The gate spacers 460 are formed on sidewalls of the gate stack 450 and may comprise a dielectric material, such as silicon nitride, silicon carbide, silicon oxynitride, other suitable materials, or combinations thereof. In some embodiments, the gate spacers are used to offset subsequently formed doped regions, such as source/drain regions. The gate spacers may further be used for designing or modifying the source/drain region (junction) profile. The gate spacers may be formed by suitable deposition and etch techniques.

Figure 10:
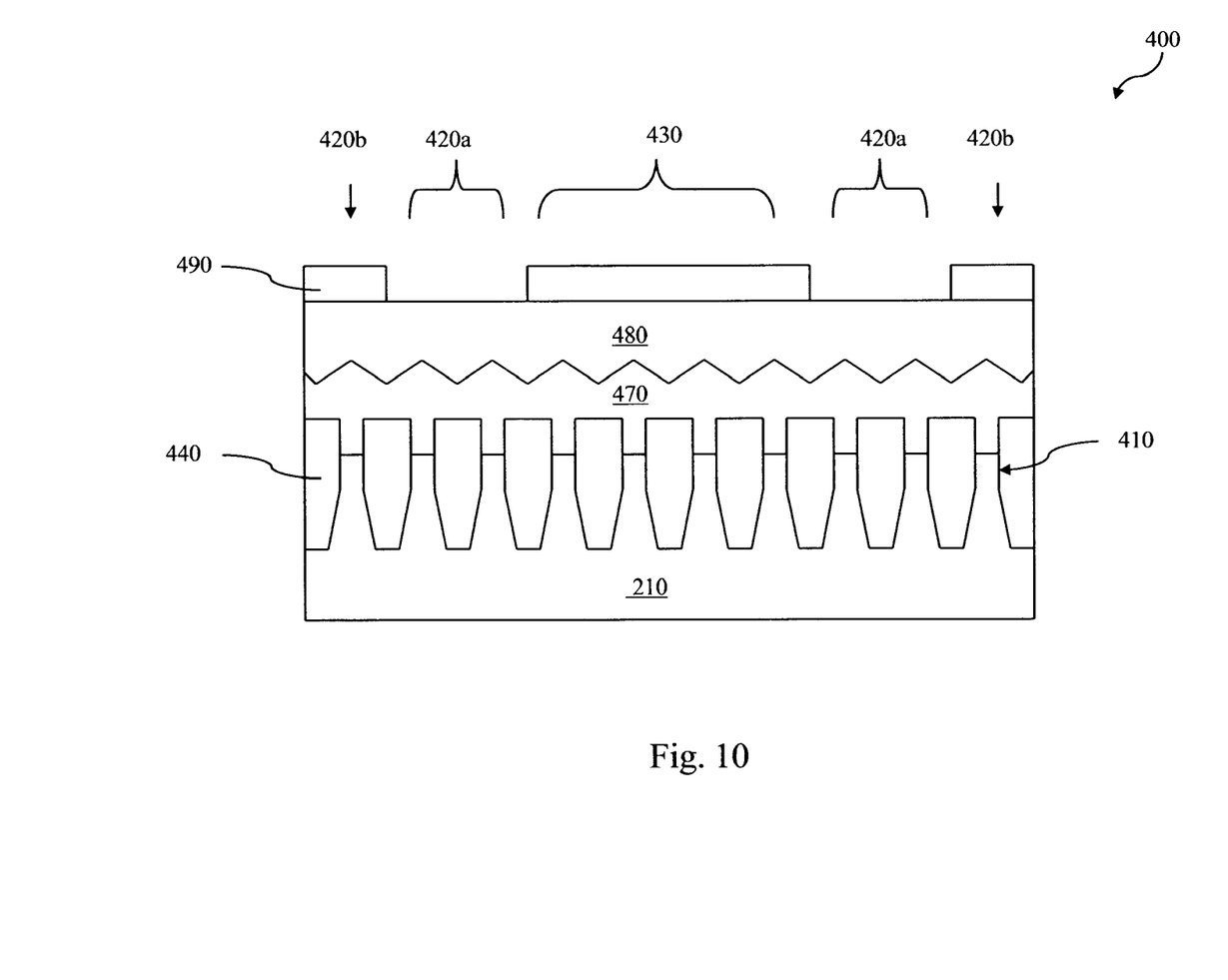

Referring to FIGS. 7 and 10, the method 300 proceeds to step 304, where a patterned photoresist layer 490 is formed to define groups of dummy fins 420. By the patterning process, the dummy fins 420 are divided into a first group of dummy fins 420a and a second group of dummy fins 420b, as shown in FIG. 10. The groups of dummy fins 420a and 420b may include one dummy fin or multiple dummy fins. The first group of dummy fins 420a is exposed within openings of the patterned photoresist layer 490 and will be exposed to a subsequent etching process. The second group of dummy fins 420b is covered by the patterned photoresist layer 490 (which also covers the active fins 430), such that the second group of dummy fins 420b (and the active fins 430) remain intact during the subsequent etching process. Additionally, in the depicted embodiment, before forming the patterned photoresist layer 490, a layer 480 is formed on the semiconductor substrate 210. The layer 480 comprises any suitable material and is formed by any suitable process. For example, the layer 480 may include various organic or inorganic materials. Photoresist layer 490 is coated on the layer 480 and patterned by a suitable patterning process.

Figure 11A:
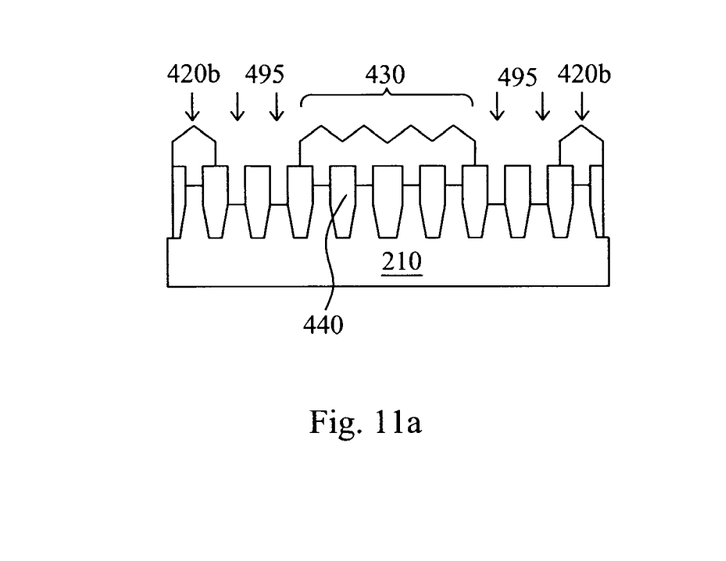

Referring to FIGS. 7 and 11a, the method 300 proceeds to step 306 by etching the first group of dummy fins 420a through openings of the patterned photoresist layer 490. The first group of dummy fins 420a is removed by an etching technique, such as a dry etch in a chemistry with fluorine-containing gases. In the present embodiment, the etching process includes two etching phases. A first phase of the etching process selectively removes the raised S/D structure 470 of the first group of dummy fins 420a. A second phase of the etching process recesses a fin height of the first group of dummy fins 420a through openings made by removal of the S/D structure 470. In one embodiment, the first group of dummy fins 420a is removed partially. In another embodiment, the first group of dummy fins 420a is removed completely. The second phase of the etching process leaves a void 495 on the semiconductor substrate after recessing the first group of dummy fins 420a. After etching the first group of dummy fins 420a, the patterned photoresist layer 490 and the layer 480 are removed by another etching process including a wet etch, a dry etch, or a combination thereof.

Figure 11B:
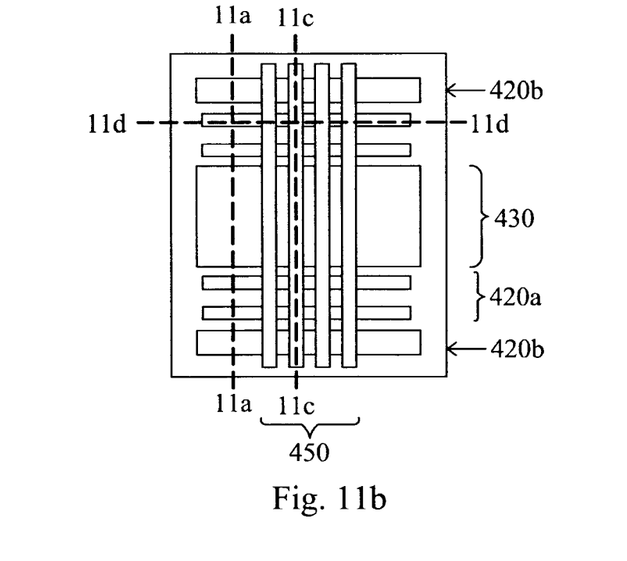
FIG. 11b is a top view of a FinFET device according to various aspects of the present disclosure.
Figure 11C:
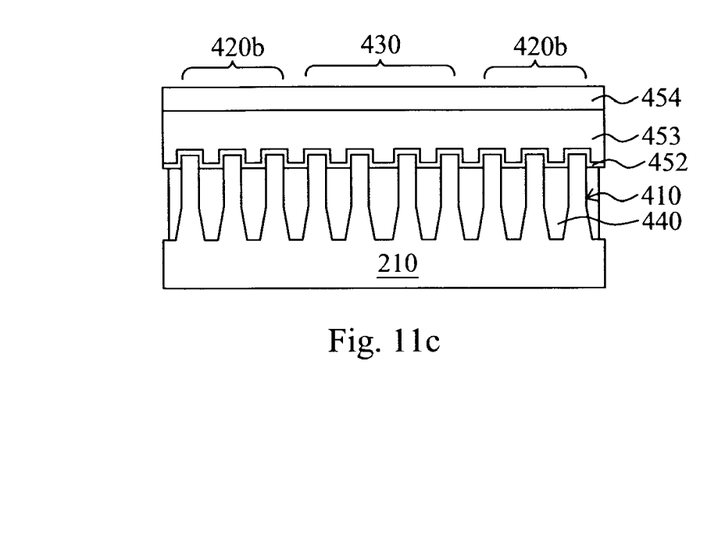
FIG. 11c illustrates a cross sectional view of a FinFET device along line 10c-10c in FIG. 10b.
Figure 11D:
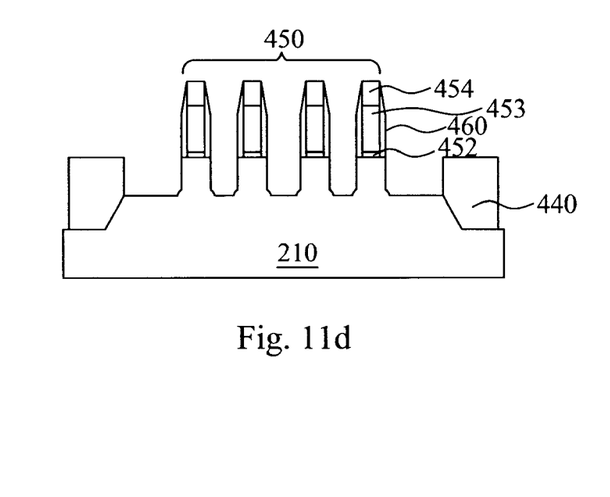
FIG. 11d illustrates a cross sectional view of a FinFET device along line 10d-10d in FIG. 10b.

FIG. 11b is a top view of the FinFET device 400. Referring to FIG. 11b, cross section views of the FinFET device 400, after etching the first group of dummy fins 420a, are taken along three lines, 11a-11a, 11c-11c and 11d-11d. FIG. 11a is a cross section view along the line 11a-11a (along the S/D region) of FIG. 11b. FIG. 11c is a cross section view along the line 11c-11c (along the channel region) of FIG. 11b and perpendicular to the direction of the line of 11a-11a. FIG. 11d is a cross section view along the line 11d-11d (along one of the first group of dummy fins) of FIG. 11b and perpendicular to the direction of the line of 11a-11a. During the etching process, a portion of the first group of dummy fins 420a having the gate stacks 450 disposed thereover remains intact because of being protected by the hard mask layer 454, as shown in FIGS. 11c and 11d.

Figure 12:
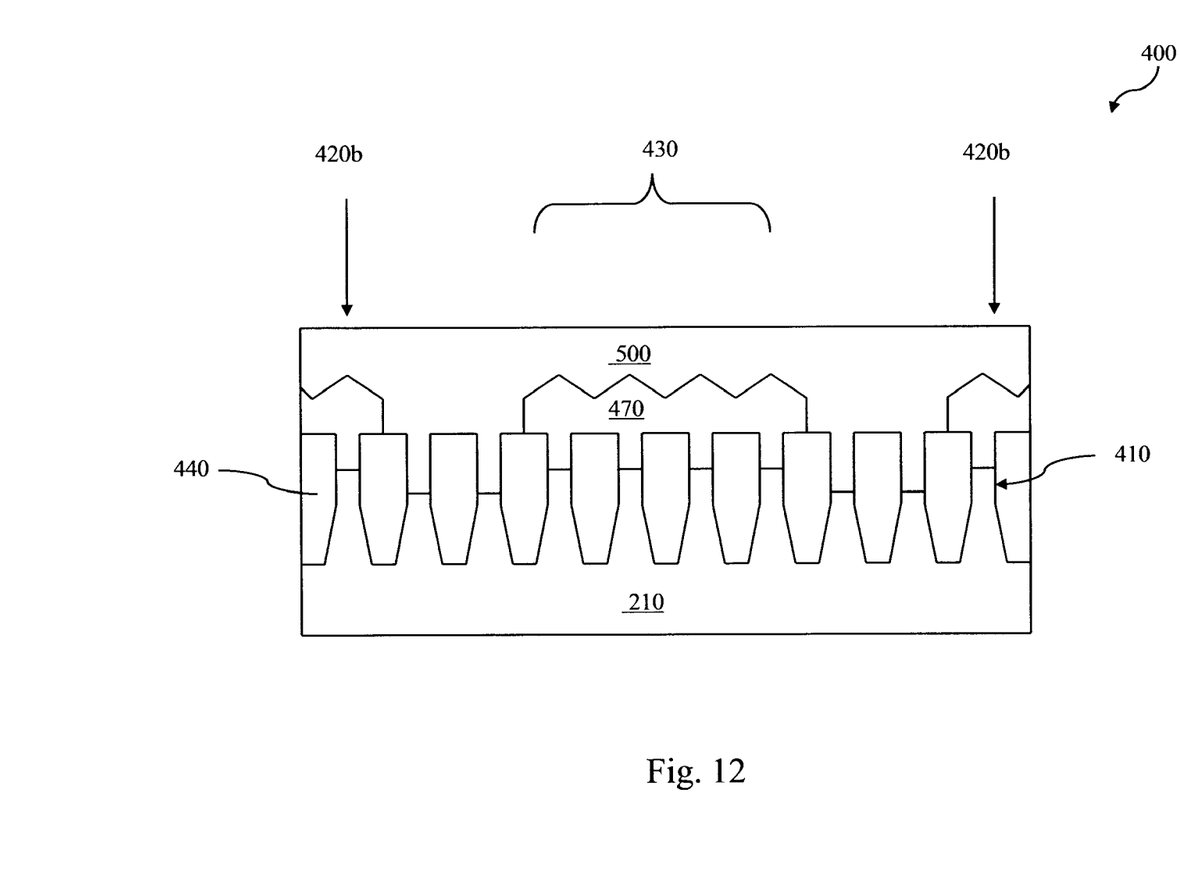
FIG. 12 illustrates a cross sectional view of various aspects of one embodiment in various stages of fabricating a FinFET device constructed according to aspects of the present disclosure.

Referring to FIGS. 7 and 12, the method 300 proceeds to step 308 by depositing and planarizing an interlayer dielectric (ILD) layer 500 on the semiconductor substrate 210. The ILD layer 500 is deposited by a proper technique, such as CVD. The ILD layer 500 includes a dielectric material, such as silicon oxide, silicon nitride, a low k dielectric material or a combination. The ILD layer 500 fills in the voids 495 on the semiconductor substrate, formed by removal of the source and drain structure in the etching process. A CMP process may be performed subsequently to provide a substantially planar surface of the ILD layer 500.

The FinFET device 400 may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the FinFET device 400. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures. In another embodiment, tungsten is used to form tungsten plugs in the contact holes.

The present disclosure provides many different embodiments of fabricating a FinFET device that provide one or more improvements over the prior art. In one embodiment, a method for fabricating a FinFET device includes providing a semiconductor substrate, etching the semiconductor substrate to form a fin structure that includes dummy fins and active fins. A patterned photoresist layer is formed to define a first group of dummy fins and a second group of dummy fins. The first group of dummy fins are etched through the patterned photoresist layer. A shallow trench isolation (STI) is formed on the semiconductor substrate after etching the first group of dummy fins.

In another embodiment, a method for fabricating a FinFET device includes receiving a FinFET precursor. The FinFET precursor includes a semiconductor substrate, dummy fins and active fins formed on the semiconductor substrate, shallow trench isolation (STI) regions formed on the semiconductor substrate, a gate stack formed on the semiconductor substrate (including a portion of the active and the dummy fins) and a source and drain structure formed on the semiconductor substrate (including another portion of the active and the dummy fins). A patterned photoresist layer is formed to define a first group of dummy fins and a second group of dummy fins. An etching process is performed to removing a portion of the first group of dummy fins, which having the source and drain structure, through the patterned photoresist layer.

In yet another embodiment, a method for fabricating a FinFET device includes providing a semiconductor substrate, forming dummy fins and active fins on the semiconductor substrate, wherein the active fins disposed between the dummy fins. A patterned photoresist layer is formed on the dummy fins and the active fins. An etching process is performed to remove the exposed portion of the dummy fins to form an open-spacing between the active fins and a remaining portion of dummy fins. A shallow trench isolation (STI) is formed on the semiconductor substrate after forming the open-spacing.

Based on the above, it can be seen that the present disclosure offers methods for fabricating a FinFET device. The method employs a novel dummy fins approach. The dummy fins approach is configured to remove a group of dummy fins while remain another group of dummy fins before a formation of STI region. Alternatively, the dummy fins approach is configured to remove the S/D structure in an S/D region and at same time remains the gate stack in the channel region of the same group of dummy fin. The dummy fin approach can be flexibly fabricated in different process stages to obtain various benefits of process control. The method demonstrates to achieve a uniform of fin's CD, profile and height in all associated locations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
 a first fin structure disposed over a substrate and having a first height;
 a second fin structure disposed over the substrate and having a second height that is different from the first height; and
 an isolation structure extending from the first fin structure to the second fin structure and at least partially covering a top surface of the second fin structure, wherein the isolation structure extends continuously from the substrate to at least the top surface of the second fin structure, the top surface of the second fin structure facing away from the substrate.

2. The device of claim 1, wherein the isolation structure completely covers the top surface of the second fin structure.

3. The device of claim 1, wherein the second fin structure is completely embedded within the isolation structure.

4. The device of claim 1, wherein the isolation structure includes a portion positioned directly over the second fin structure.

5. The device of claim 1, wherein the first height is greater than the second height.

6. The device of claim 1, wherein the second fin structure is a dummy fin structure having no functionality in the device.

7. The device of claim 1, further comprising a third fin structure disposed over the substrate and having a third height that is different from the first height.

8. A device comprising:
a first fin structure disposed over a substrate and having a first height;
a second fin structure disposed over the substrate and having a second height that is different from the first height;
a shallow trench isolation structure disposed between the first and second fin structures and at least partially covering a top surface of the second fin structure, the top surface of the second fin structure facing away from the substrate; and
an interlayer dielectric layer disposed over the first and second fin structures.

9. The device of claim 8, further comprising a raised source/drain feature disposed over a physically contacting the first fin structure.

10. The device of claim 9, wherein the raised source/drain feature physically contacts the shallow trench isolation structure.

11. The device of claim 8, further comprising a gate structure disposed over the first and second fin structures.

12. The device of claim 8, further comprising a third fin structure disposed over the substrate and having a third height that is different from the first height.

13. The device of claim 12, wherein the interlayer dielectric layer physically contacts the third fin structure.

14. The device of claim 8, wherein the shallow trench isolation structure extends from the first fin structure to the second fin structure.

15. A device comprising:
a first fin structure extending from a semiconductor substrate and having a first height, the first fin structure formed from the semiconductor substrate;
a second fin structure extending from a semiconductor substrate and having a second height that is different from the first height, the second fin structure formed from the semiconductor substrate; and
a shallow trench isolation structure disposed between the first and second fin structures and at least partially covering a top surface of the second fin structure, the top surface of the second fin structure facing away from the semiconductor substrate.

16. The device of claim 15, wherein the shallow trench isolation structure extends continuously from the semiconductor substrate to the top surface of the second fin structure.

17. The device of claim 15, wherein the top surface of the second fin structure extends between opposing sidewall surfaces of the second fin structure, and
wherein the shallow trench isolation structure physically contacts the top surface and opposing sidewall surfaces of the second fin structure.

18. The device of claim 15, wherein the shallow trench isolation structure completely covers the top surface of the second fin structure.

19. The device of claim 15, further comprising a third fin structure adjacent the first fin structure, and wherein the shallow trench isolation structure extends continuously from the second fin structure to the third fin structure such that the shallow trench isolation structure physically contacts a top surface of the third fin structure and physically contacts opposing sidewalls of the third fin structure, wherein the top surface of the third fin structure extends between the opposing sidewalls of the third fin structure.

20. The device of claim 8, wherein the first fin structure is formed from the semiconductor substrate, and
wherein the second fin structure is formed from the semiconductor substrate.

* * * * *